United States Patent
Cao et al.

(10) Patent No.: US 7,671,588 B2
(45) Date of Patent: Mar. 2, 2010

(54) MRI APPARATUS AND RF TRANSMIT GAIN SETTING METHOD

(75) Inventors: Kai Cao, Beijing (CN); Qingyu Dai, Beijing (CN)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 12/136,695

(22) Filed: Jun. 10, 2008

(65) Prior Publication Data

US 2008/0309338 A1    Dec. 18, 2008

(30) Foreign Application Priority Data

Jun. 15, 2007    (CN)    ............ 2007 1 0110371

(51) Int. Cl.
    *G01V 3/00*    (2006.01)
(52) U.S. Cl. .................... 324/307; 324/309
(58) Field of Classification Search ......... 324/300–322; 600/410–435; 333/219–235; 343/825–831, 343/904–916; 702/57–85, 106–107
    See application file for complete search history.

(56) References Cited

U.S. PATENT DOCUMENTS

| | | | |
|---|---|---|---|
| 2,538,915 A * | 1/1951 | Rowland ............... 343/809 |
| 4,806,866 A | 2/1989 | Maier | |
| 5,107,215 A | 4/1992 | Schaefer et al. | |
| 5,382,922 A * | 1/1995 | Gersbach et al. ............ 331/1 A |
| 5,440,756 A * | 8/1995 | Larson ................... 704/278 |
| 5,451,876 A | 9/1995 | Sandford et al. | |
| 5,471,141 A | 11/1995 | Yoshida et al. | |
| 6,011,770 A * | 1/2000 | Tan ..................... 369/124.13 |
| 6,025,718 A * | 2/2000 | Hushek ................... 324/316 |
| 6,046,594 A * | 4/2000 | Mavretic ................. 324/520 |
| 6,111,411 A | 8/2000 | Saranathan et al. | |
| 6,288,545 B1 | 9/2001 | King et al. | |
| 6,426,623 B1 | 7/2002 | Bernstein | |
| 6,448,770 B1 | 9/2002 | Liu et al. | |
| 7,010,419 B2 * | 3/2006 | Abe et al. ............... 701/111 |
| 7,068,032 B2 | 6/2006 | Agilandam et al. | |
| 7,142,062 B2 * | 11/2006 | Vaananen et al. ........... 331/11 |

* cited by examiner

*Primary Examiner*—Brij B Shrivastav
*Assistant Examiner*—Dixomara Vargas
(74) *Attorney, Agent, or Firm*—Armstrong Teasdale LLP

(57) ABSTRACT

An MRI apparatus which obtains a tomogram of an object by utilizing magnetic resonance includes a calibrating device which figures out a relationship between a center frequency and an optimal gain of RF transmission with respect to a predetermined range of central frequencies, a saving device which saves information expressing said relationship, and a setting device which sets the RF transmission gain according to the center frequency during subsequent scanning by utilizing the saved information.

20 Claims, 4 Drawing Sheets

FIG. 4

|    | Central Frequency. | Transmit Gain |
|----|--------------------|---------------|
| 1  | 8.549322           | 96            |
| 2  | 8.549276           | 97            |
| 3  | 8.549207           | 98            |
| 4  | 8.549106           | 98            |
| 5  | 8.548967           | 98            |
| 6  | 8.54879            | 98            |
| 7  | 8.548582           | 98            |
| 8  | 8.548335           | 98            |
| 9  | 8.548056           | 98            |
| 10 | 8.54775            | 99            |
| 11 | 8.547418           | 100           |
| 12 | 8.547062           | 100           |
| 13 | 8.546687           | 103           |
| 14 | 8.546288           | 111           |
| 15 | 8.545878           | 125           |
| 16 | 8.545453           | 143           |
| 17 | 8.545012           | 159           |

MRI APPARATUS AND RF TRANSMIT GAIN SETTING METHOD

CROSS REFERENCE TO RELATED APPLICATIONS

This application claims the benefit of Chinese Patent Application No. 200710110317.5 filed Jun. 15, 2007, which is hereby incorporated by reference in its entirety.

BACKGROUND OF THE INVENTION

The subject matter disclosed herein relates to an MRI apparatus (Magnetic Resonance Imaging) apparatus and an RF (radio frequency) transmission gain setting method, and more particularly to an MRI apparatus which obtains tomograms of the object by utilizing magnetic resonance and an RF transmission gain setting method for MRI apparatuses.

In an MRI apparatus, a prescan is done before taking an image, and calibration is performed to optimize the central frequency and the gain of RF transmission by using the imaged data. By the calibration, the center frequency of RF transmission is so adjusted as to be identical with the Larmor frequency of the spin of the object, and the gain of RF transmission is so adjusted as to set the flip angle of spin excitation exactly to a prescribed angle (see U.S. Pat. No. 4,806,866 and/or U.S. Pat. No. 6,025,718, for instance).

In an MRI apparatus that generates its main magnetic field with a permanent magnet requires frequent prescanning for calibration because the influence of heating of the gradient magnet field coil causes the magnetic field intensity to drift dependent on the temperature characteristics of the permanent magnet and along with that the Larmor frequency varies. This extends the time required for imaging, with a correspondingly increased load on the patient and inconvenience to the user.

BRIEF DESCRIPTION OF THE INVENTION

It is desirable that problems described previously are solved.

In a first aspect, the invention provides an MRI apparatus which obtains a tomogram of an object by utilizing magnetic resonance, including a calibrating device which figures out a relationship between a center frequency and an optimal gain of RF transmission with respect to a predetermined range of central frequencies, a saving device which saves information expressing the relationship, and a setting device which sets the RF transmission gain according to the center frequency during subsequent scanning by utilizing the saved information.

In a second aspect, the invention provides the MRI apparatus according to the first aspect, wherein the information is saved as a mathematical table.

In a third aspect, the invention provides the MRI apparatus according to the first aspect, wherein the information is saved as a gain curve.

In a fourth aspect, the invention provides the MRI apparatus according to the first aspect, wherein the information is saved as a numerical expression.

In a fifth aspect, the invention provides the MRI apparatus according to any of the second aspect through the fourth aspect, wherein the information is saved for each RE coil.

In a sixth aspect, the invention provides the MRI apparatus according to the first aspect, wherein the center frequency of RF transmission during the scanning is figured out by calibration.

In a seventh aspect, the invention provides the MRI apparatus according to the sixth aspect, wherein the center frequency is corrected according to variations in intensity of a main magnetic field.

In an eighth aspect, the invention provides the MRI apparatus according to the seventh aspect, wherein variations in the intensity of the main magnetic field are figured out according to the temperature characteristics of a main magnetic field magnet.

In a ninth aspect, the invention provides the MRI apparatus according to the ninth aspect, wherein the temperature of the main magnetic field magnet is predicted according to a calorific value of heat generated by a gradient magnetic field coil.

In a tenth aspect, the invention provides the MRI apparatus according to the ninth aspect, wherein the calorific value of heat generated by the gradient magnetic field coil is predicted according to a scan protocol.

In an eleventh aspect, the invention provides an RF transmission gain setting method for an MRI apparatus which take a tomogram of an object by utilizing magnetic resonance, including the steps of: figuring out a relationship between a center frequency and an optimal gain of RF transmission with respect to a predetermined range of central frequencies by calibration; saving information expressing the relationship; and setting the RF transmission gain according to the center frequency during subsequent scanning by utilizing the saved information.

In a twelfth aspect, the invention provides the RF transmission gain setting method according to the eleventh aspect, wherein the information is saved as a mathematical table.

In a thirteenth aspect, the invention provides the RF transmission gain setting method according to the eleventh aspect, wherein the information is saved as a gain curve.

In a fourteenth aspect, the invention provides the RF transmission gain setting method according to the eleventh aspect, wherein the information is saved as a numerical expression.

In its fifteenth aspect, the invention provides the RF transmission gain setting method according to any of the twelfth aspect through the fourteenth aspect, wherein the information is saved for each RF coil.

In its sixteenth aspect, the invention provides the RF transmission gain setting method according to the eleventh aspect, wherein the center frequency of RF transmission during the scanning is figured out by calibration.

In a seventeenth aspect, the invention provides the RF transmission gain setting method according to the sixteenth aspect, wherein the center frequency is corrected according to variations in the intensity of the main magnetic field.

In its eighteenth aspect, the invention provides the RF transmission gain setting method according to the seventeenth aspect, wherein variations in the intensity of the main magnetic field are figured out according to the temperature characteristics of the main magnetic field magnet.

In its nineteenth aspect, the invention provides the RF transmission gain setting method according to the eighteenth aspect, wherein the temperature of the main magnetic field magnet is predicted according to a calorific value of heat generated by a gradient magnetic field coil.

In its twentieth aspect, the invention provides the RF transmission gain setting method according to the nineteenth aspect, wherein the calorific value of heat generated by the gradient magnetic field coil is predicted according to a scan protocol.

Since the MRI apparatus according to the invention is an MRI apparatus which obtains a tomogram of an object by utilizing magnetic resonance, including a calibrating device which figures out the relationship between the center frequency and the optimal gain of RF transmission with respect to a predetermined range of central frequencies, a saving device which saves information expressing the relationship, and a setting device which sets the RF transmission gain according to the center frequency during subsequent scanning by utilizing the saved information, an MRI apparatus improving the efficiency of calibration can be realized.

Further, since the RF transmission gain setting method according to the invention is an RF transmission gain setting method for an MRI apparatus which take a tomogram of an object by utilizing magnetic resonance, wherein the relationship between the center frequency and the optimal gain of RF transmission is figured out in a predetermined range of central frequencies by calibration, information expressing the relationship is saved, and the RF transmission gain is set according to the center frequency during subsequent scanning by utilizing the saved information, an RF transmission gain setting method improving the efficiency of calibration can be realized.

As the information may be saved as a mathematical table, gain values can be saved discretely.

As the information may be saved as a gain curve, gain values can be saved continuously.

As the information may be saved as a numerical expression, gain values can be obtained by calculation.

As the information may be saved for each RF coil, adaptation to individual RF coils is made possible.

As the center frequency of RF transmission during the scanning may be figured out by calibration, a center frequency based on an actually measured Larmor frequency can be obtained.

As the center frequency may be corrected according to variations in the intensity of the main magnetic field, a center frequency matching a variation in the Larmor frequency can be obtained.

As variations in the intensity of the main magnetic field may be figured out according to the temperature characteristics of the main magnetic field magnet, adaptation to the temperature characteristics of the main magnetic field magnet is made possible.

As the temperature of the main magnetic field magnet may be predicted according to the calorific value of heat generated by a gradient magnetic field coil, the temperature of the main magnetic field magnet can be properly figured out.

As the calorific value of heat generated by the gradient magnetic field coil may be predicted according to a scan protocol, the calorific value of heat generated by the gradient magnetic field coil can be accurately figured out.

Further objects and advantages of the present invention will be apparent from the following description of the preferred embodiments of the invention as illustrated in the accompanying drawings.

BRIEF DESCRIPTION OF THE DRAWINGS

FIG. 4 is a diagram showing one example of mathematical table of the center frequency and the optimal gain.

DETAILED DESCRIPTION OF THE INVENTION

Figure 1:
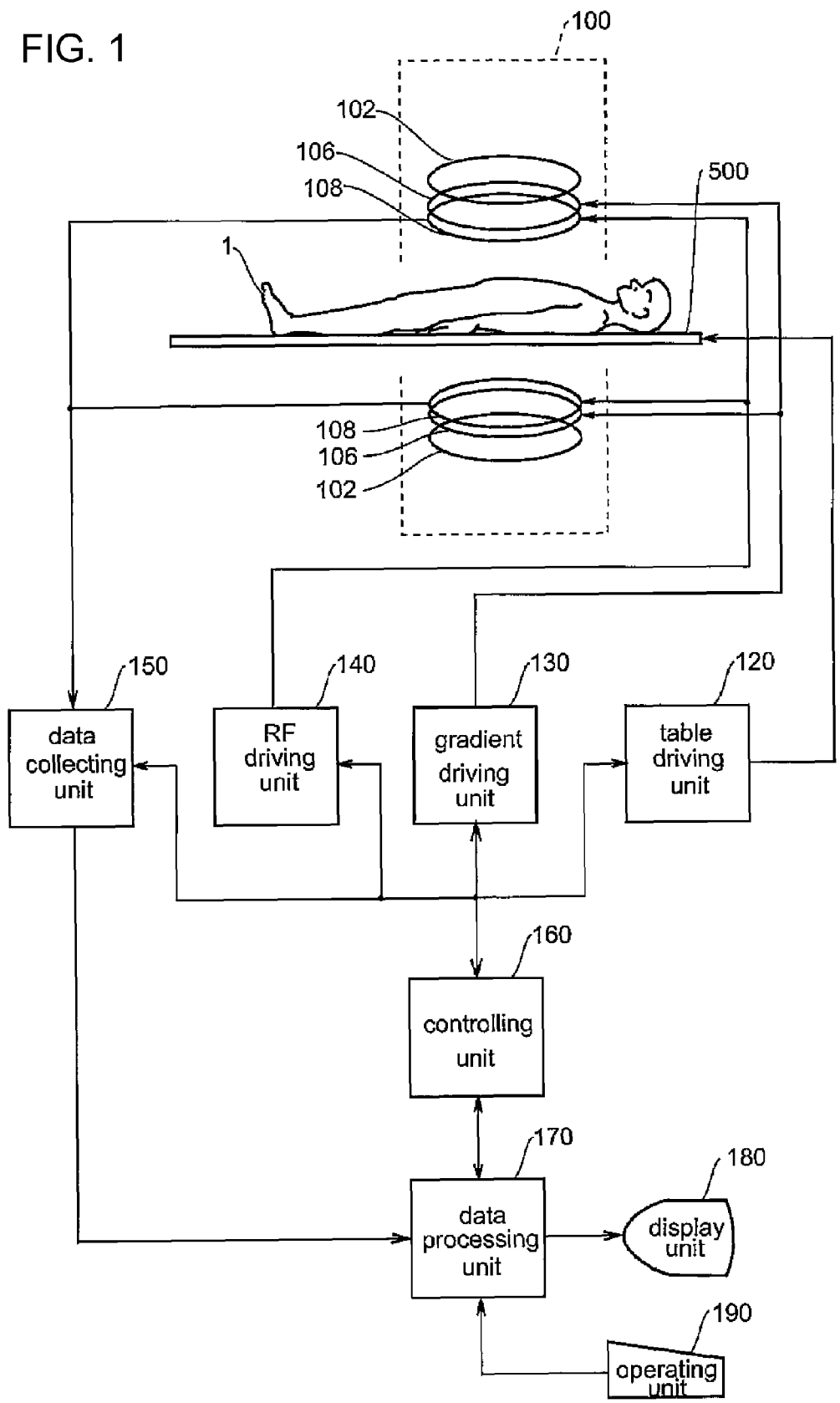
FIG. 1 is a block diagram of an MRI apparatus in one example of best modes for carrying out the invention.

Best modes for carrying out the invention will be described in detail below with reference to the drawings. Incidentally, the invention is not limited to these best modes for implementing it. A block diagram of an MRI apparatus is shown in FIG. 1. The configuration of this apparatus represents one example of best modes for carrying out the invention regarding MRI apparatuses.

As shown in FIG. 1, this apparatus has a magnetic field generating device 100. The magnetic field generating device 100 has main magnetic field magnet units 102, gradient coil units 106 and RF coil units 108. An object 1, mounted on a table 500, is brought in and out of the internal space of the magnetic field generating device 100. The table 500 is driven by a table driving unit 120.

Each item of these main magnetic field magnet units 102, gradient coil units 106 and RF coil units 108 is provided in a pair, one piece opposed to the other with a space in-between. Each has a substantially planar shape, and all are arranged around a common center axis.

The main magnetic field magnet units 102 generate the main magnetic field in the internal space of the magnetic field generating device 100. The main magnetic field is a magnetostatic field in which the magnetic field intensity is constant. The direction of the magnetostatic field crosses the body axis direction of the object 1 substantially orthogonally. In other words, it generates a so-called vertical magnetic field. The main magnetic field magnet units 102 are formed of permanent magnets.

The gradient coil units 106 generate three gradient magnetic fields to give a gradient in magnetostatic field intensity in the direction of each of mutually normal axes including the slice axis, the phase axis and the frequency axis. The gradient coil units 106 have three gradient coils, not shown, one for each of the three gradient magnetic fields.

The RF coil units 108 transmit RF pulses (radio frequency pulses) for exciting spins within the body of the object 1. The RF coil units 108 also receive magnetic resonance signals that the excited spins give rise to. The RF coil units 108 perform transmission and reception either with the same coils or with different coils.

A gradient driving unit 130 is connected to the gradient coil units 106. The gradient driving unit 130 provides driving signals to the gradient coil units 106 to have gradient magnetic fields generated. The gradient driving unit 130 has three lines of driving circuits, not shown, one for each of the three gradient coils in the gradient coil units 106.

An RF driving unit 140 is connected to the RF coil units 108. The RF driving unit 140 provides driving signals to the RF coil units 108 to have RF pulses transmitted thereby to excite spins within the body of the object 1.

A data collecting unit 150 is connected to the RF coil units 108. The data collecting unit 150 captures the receive signals received by the RF coil units 108 by sampling, and collects them as digital data.

A control unit 160 is connected to the table driving unit 120, the gradient driving unit 130, the RF driving unit 140 and the data collecting unit 150. The control unit 160 accomplishes imaging by controlling the table driving unit 120 to the data collecting unit 150.

The control unit 160 is configured of, for instance, a computer. The control unit 160 has a memory. The memory stores programs and various data for the control unit 160. The functions of the control unit 160 are realized by the execution by the computer of programs stored in the memory.

The output side of the data collecting unit 150 is connected to a data processing unit 170. Data collected by the data collecting unit 150 are inputted to the data processing unit 170. The data processing unit 170 is configured of, for instance, a computer. The data processing unit 170 has a memory. The memory stores programs and various data for the data processing unit 170.

The data processing unit 170 is connected to the control unit 160. The data processing unit 170 is positioned superior to and supervises the control unit 160. The functions of this unit are realized by the execution by the data processing unit 170 of programs stored in the memory.

The data processing unit 170 stores data collected by the data collecting unit 150 into a memory. A data space is formed in the memory. This data space constitutes a Fourier space. The Fourier space is also referred to as a k-space. The data processing unit 170 reconstructs an image of the object 1 by subjecting data in the k-space to inverse Fourier transform.

A display unit 180 and an operating unit 190 are connected to the data processing unit 170. The display unit 180 is configured of a graphic display or the like. The operating unit 190 is configured of a keyboard or the like provided with a pointing device.

The display unit 180 displays reconstructed image and various information outputted from the data processing unit 170. The operating unit 190, operated by the user, inputs various instructions, information and the like to the data processing unit 170. The user can interactively operate this apparatus through the display unit 180 and the operating unit 190.

The method of RF transmission gain setting in this apparatus will be described. This method is one of the best modes for carrying out the invention. This method represents one example of best modes for carrying out the invention regarding RF transmission gain setting methods.

For the setting of the RF transmission gain, information expressing the relationship between the center frequency and the optimal gain of RF transmission is utilized. This information is acquired experimentally in advance, and stored into the memory of the data processing unit 170. The relationship between the center frequency and the optimal gain of RF transmission is unique to the system and the RF coil and, once it is acquired, can be utilized repeatedly.

Figure 2:
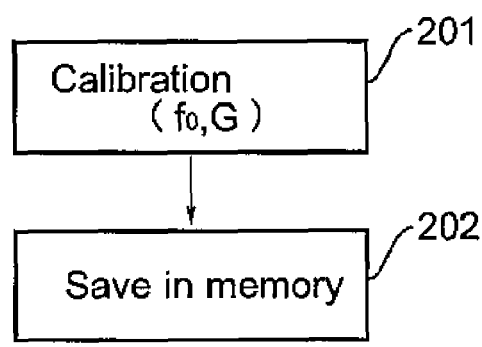
FIG. 2 is a flowchart illustrating an exemplary workflow for figuring out the relationship between the center frequency and the optimal gain of RF transmission.

FIG. 2 charts the workflow for figuring out the relationship between the center frequency and the optimal gain of RF transmission. This workflow is accomplished under the control of the data processing unit 170. As shown in FIG. 2, calibration is performed at step 201. The calibration is performed by a technique similar to usual prescanning. The center frequency $f_0$ of the RF transmission and the optimal gain G for that frequency are thereby determined.

The calibration is carried out in a predetermined range of central frequencies, and the optimal gain for each frequency in the range is definitely determined. The data processing unit 170 that performs calibration at step 201 is one example of a calibrating device according to the invention.

Figure 3:
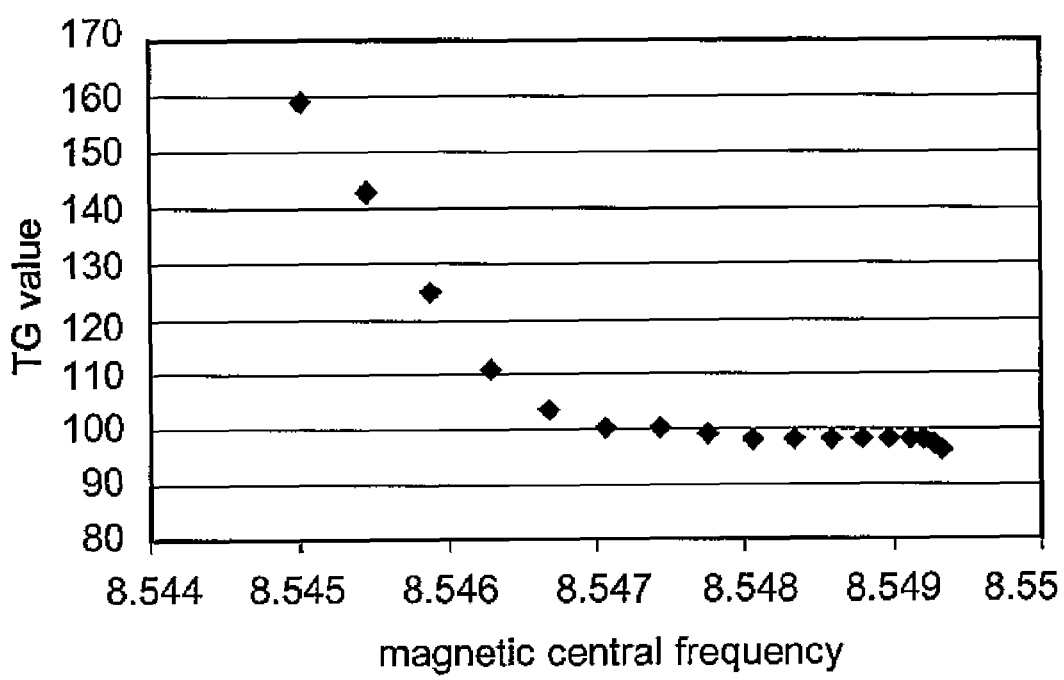
FIG. 3 is a diagram showing an example of relationship between the center frequency and the optimal gain.

The calibration is performed for each RF coil. This results in definite determination of the relationship between the center frequency and the optimal gain for each RF coil in the prescribed frequency range. One example of relationship between the center frequency and the optimal gain is shown in FIG. 3.

At step 202, information expressing the relationship between center frequency and the optimal gain is stored into the memory. The data processing unit 170 that performs storing at step 202 is one example of a saving device according to the invention. The information is saved as a mathematical table. One example of mathematical table is shown in FIG. 4. Incidentally, the information to be saved is not limited to a mathematical table, but may instead be a gain curve or a numerical expression functionally approximating it.

Figure 5:
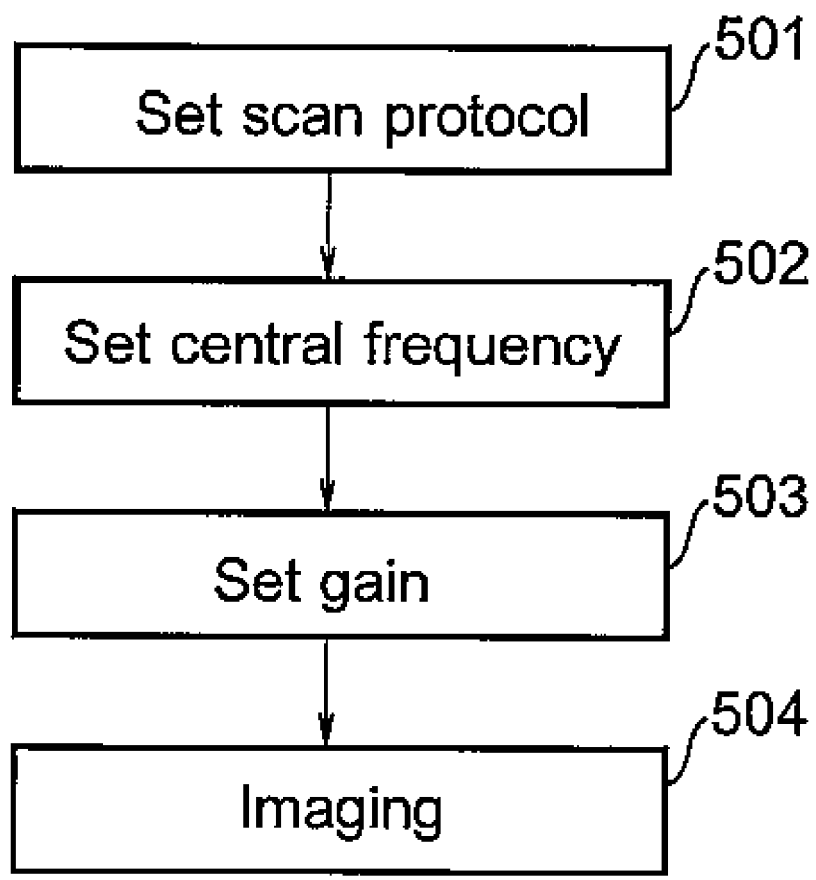
FIG. 5 is a flowchart illustrating an exemplary workflow of imaging by the MRI apparatus in one example of best modes for carrying out the invention.

FIG. 5 charts the workflow of imaging utilizing such information. The imaging is accomplished under the control of the data processing unit 170. As shown in FIG. 5, a scan protocol is set at step 501. The setting of the scan protocol is accomplished by the user through the operating unit 190. This results in the setting of scanning conditions including the pulse sequence.

At step 502, the center frequency of RF transmission is set. To set the center frequency, first, FID (free induction decay) signals are collected by prescanning, and their center frequency, namely the Larmor frequency is identified. Next, this frequency is modified according to the impact of the heating of the gradient magnetic field coils on the main magnetic field, and the center frequency of RF transmission is so set as to be identical with the modified frequency.

The calorific value of the heating of the gradient magnetic field coils is predicted from the scan protocol, the intensity variation of the main magnetic field is predicted from this calorific value and the temperature characteristics of the main magnetic field magnet units 102, and the variation of the Larmor frequency is predicted from the intensity variation of the main magnetic field.

At step 503, the gain of RF transmission is set. To set the gain, information expressing the relationship between center frequency and the optimal gain saved in the memory in advance, including the mathematical table shown in FIG. 4, is utilized. This results in setting of the optimal gain. The data processing unit 170 that performs gain setting at step 503 is one example of a setting device according to the invention.

Imaging is accomplished at step 504. Since RF transmission during imaging is performed according to the set center frequency and gain as described above, spin excitation is properly accomplished. As a result, relatively noise-free data can be collected, and high quality reconstructed images can be obtained.

Since gain setting utilizes pre-saved information in this apparatus, no prescan for gain setting is needed. As this feature results in enhanced efficiency of calibration and a reduced length of time required for imaging, the load on the patient is alleviated and the user's satisfaction is increased.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging (MRI) apparatus configured to obtain a tomogram of an object utilizing magnetic resonance, said MRI apparatus comprising:

a calibrating device configured to determine a relationship between a center frequency of radio frequency (RF) transmission and an optimal gain of RF transmission with respect to a predetermined range of central frequencies;

a saving device configured to save information expressing the relationship; and a setting device configured to set the RF transmission gain according to the relationship between the center frequency and the optimal gain of RF transmission during subsequent scanning by utilizing the saved information.

2. The MRI apparatus according to claim 1, wherein:
the information is saved as a mathematical table.

3. The MRI apparatus according to claim 2, wherein:
the information is saved for each of a plurality of RF coils.

4. The MRI apparatus according to claim 1, wherein:
the information is saved as a gain curve.

5. The MRI apparatus according to claim 1, wherein:
the information is saved as a numerical expression.

6. The MRI apparatus according to claim 1, wherein:
the center frequency of RF transmission used during scanning is determined by calibration.

7. The MRI apparatus according to claim 6, wherein:
the center frequency is corrected according to variations in intensity of a main magnetic field.

8. The MRI apparatus according to claim 7, wherein:
variations in the intensity of the main magnetic field are determined according to temperature characteristics of a main magnetic field magnet.

9. The MRI apparatus according to claim 8, wherein:
a temperature of said main magnetic field magnet is predicted according to a calorific value of heat generated by a gradient magnetic field coil.

10. The MRI apparatus according to claim 9, wherein:
the calorific value of heat generated by said gradient magnetic field coil is predicted according to a scan protocol.

11. A radio frequency (RF) transmission gain setting method for a magnetic resonance imaging (MRI) apparatus configured to obtain a tomogram of an object by utilizing magnetic resonance, said method comprising:
determining a relationship between a center frequency of RF transmission and an optimal gain of RF transmission with respect to a predetermined range of central frequencies by calibration;
saving information expressing the determined relationship; and
setting an RF transmission gain according to the center frequency during subsequent scanning utilizing the saved information.

12. The RF transmission gain setting method according to claim 11, wherein:
saving the information comprises saving the information as a mathematical table.

13. The RF transmission gain setting method according to claim 12, wherein:
saving the information comprises saving the information for each of a plurality of RF coils.

14. The RF transmission gain setting method according to claim 11, wherein:
saving the information comprises saving the information as a gain curve.

15. The RF transmission gain setting method according to claim 11, wherein:
saving the information comprises saving the information as a numerical expression.

16. The RF transmission gain setting method according to claim 11, further comprising:
determining the center frequency of RF transmission to be used during scanning according to a calibration.

17. The RF transmission gain setting method according to claim 16, further comprising:
correcting the center frequency according to variations in intensity of a main magnetic field.

18. The RF transmission gain setting method according to claim 17, further comprising:
determining the variations in the intensity of the main magnetic field according to temperature characteristics of a main magnetic field magnet.

19. The RF transmission gain setting method according to claim 18, further comprising:
estimating the temperature of the main magnetic field magnet according to a calorific value of heat generated by a gradient magnetic field coil.

20. The RF transmission gain setting method according to claim 19, further comprising:
estimating the calorific value of heat generated by the gradient magnetic field coil according to a scan protocol.

* * * * *